(12) United States Patent
Fischer et al.

(10) Patent No.: US 6,407,586 B2
(45) Date of Patent: Jun. 18, 2002

(54) FUSIBLE LINK CONFIGURATION IN INTEGRATED CIRCUITS

(75) Inventors: Helmut Fischer, Taufkirchen; Jochen Müller, München, both of (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/781,813

(22) Filed: Feb. 12, 2001

(30) Foreign Application Priority Data

Feb. 11, 2000 (DE) .......................... 100 06 243

(51) Int. Cl.$^7$ .................. H03K 19/00; G11C 7/00; H01L 27/10
(52) U.S. Cl. ................ 326/101; 326/47; 365/225.7; 257/209
(58) Field of Search ................ 326/101, 102, 326/38, 47; 257/209, 529, 530; 365/225.7; 327/525

(56) References Cited

U.S. PATENT DOCUMENTS

| | | | |
|---|---|---|---|
| 4,910,418 A | * 3/1990 | Graham et al. | 326/38 |
| 5,495,181 A | * 2/1996 | Kolze | 326/38 |
| 5,532,966 A | 7/1996 | Poteet et al. | 365/200 |
| 5,832,425 A | 11/1998 | Berger | 365/200 |
| 5,859,801 A | * 1/1999 | Poechmueller | 365/200 |
| 6,154,399 A | * 11/2000 | Ogishima | 365/200 |

* cited by examiner

Primary Examiner—Michael Tokar
Assistant Examiner—James H Cho
(74) Attorney, Agent, or Firm—Laurence A. Greenberg; Werner H. Stemer; Gregory L. Mayback

(57) ABSTRACT

The invention relates to a fusible link configuration in or on integrated circuits, in particular highly integrated memory chips, in which in each case one bank of fusible links ($F_1$, $F_2$, ...), together with an evaluation logic unit is configured beside and in association with a memory field segment. The evaluation logic unit is electrically connected to the fusible links ($F_1$, $F_2$, ...) and determines whether one or more of the fusible links ($F_1$, $F_2$, ...) is severed. One or more banks of the fusible links ($F_1$, $F_2$, ...) are divided up into smaller units while restricting the width(s) of the bank or banks. The units are grouped such that at least some of the fusible links ($F_1$, $F_2$, ...) are located beside one another transversely with respect to the width direction of the bank.

5 Claims, 2 Drawing Sheets

FUSIBLE LINK CONFIGURATION IN INTEGRATED CIRCUITS

BACKGROUND OF THE INVENTION

Field of the Invention

The invention relates to a fusible link configuration in or on integrated circuits, in particular highly integrated memory chips, in which in each case one bank of fusible links together with an evaluation logic unit is configured beside and is associated with a memory field segment. The evaluation logic unit is electrically connected to the fusible links and determines whether one or more of the fusible links is severed. The invention also relates to a use of the same in a highly integrated memory chip.

The known typical configuration of the fusible links on a highly integrated memory chip will be described using FIG. 3. The fusible links (so-called fuses) $F_1$, $F_2$ and so on are overall associated physically with a memory field segment 20, and together with an evaluation logic unit 21, are configured beside the memory field segment 20. Referring to FIG. 3, the fusible links $F_1$, $F_2$ and so are configured underneath the memory field segment 20 in the lateral direction (in the direction of the arrow B). The entire configuration of the fusible links $F_1$, $F_2$ and so on form one bank 10 which, in turn, is subdivided into individual fusible-link boxes 101, 102, 103, . . . , 106. Within one box 101–106 there may be, for example, twelve fusible links $F_1$, $F_2$, . . . . The evaluation logic unit 21 has the function of determining whether one of the fusible links $F_1$, $F_2$ and so on is severed or not.

Fusing individual fusible links is carried out with a laser beam aimed at the region in which the bank 10 of fusible links is located. One speaks of shooting through individual fusible links. This necessitates that the region of the bank 10 be open for the laser beam. That is to say, in the region of the bank 10, a window must remain free for the laser beam.

Specific methods of making contact with memory chips at the wafer level require that additional contact pads be fitted on the chip surface. Contact cannot be made directly with the existing contact pads which have only small interspacings. Large interspacings must be provided between the pads when using these specific chip contact-making methods. It is therefore necessary for the small contact pads to be wired to the additional contact pads by means of conductor tracks.

FIGS. 1 and 2 are respectively a schematic cross-sectional view and a plan view, showing a configuration of small contact pads 4 on a chip 1 and of additional larger contact pads 3, 5 and 6, which are separated from the chip 1 by an insulation layer 2. The additional larger contact pads 3, 5 and 6 are connected to the small contact pads (the original pads) 4 by additional conductor tracks 7, 8, 9.

If this method of making contact, which makes providing the larger contact pads 3, 5 and 6 necessary, is performed before the fusible links located on the chip 1 in a bank indicated by 10 are severed in the testing process, it is possible for the conductor tracks 7, 8, 9 which are additionally necessary to conceal the fusible-link banks 10 located underneath them. This makes it no longer possible to sever all of the fusible links.

In FIG. 2, two conductor tracks 7 and 9 are shown which cover a fusible-link bank 10. The result of this is, amongst other things, that memory cells which are defective for the chip 1 can no longer be replaced by redundant ones. Depending on the geometry of the wiring, differently sized regions of the fusible links are covered.

SUMMARY OF THE INVENTION

It is accordingly an object of the invention to provide a fusible link configuration in or on integrated circuits, in particular highly integrated memory chips, which overcomes the above-mentioned disadvantageous of the prior art apparatus of this general type, and with which the above-described problem of covering the fusible-link bank by conductor tracks located above them is avoided.

The object is achieved by dividing the fusible-link banks up into smaller units, and rearranging the aforementioned units in such a way that the wiring located above no longer covers the fusible links, so that the severing of the fusible links is made possible in exactly the same way as without the presence of the additional wiring.

With the foregoing and other objects in view there is provided, in accordance with the invention a fusible link configuration in or on integrated circuits, that includes: a memory field segment; at least one bank of fusible links defining a total number of the fusible links and configured beside and associated with the memory field segment; and an evaluation logic unit electrically connected to the fusible links for determining whether one or more of the fusible links is severed. The at least one bank of the fusible links is divided into units of the fusible links. Each one of the units of the fusible links includes a smaller number of the fusible links than the total number of the fusible links. The units of the fusible links are grouped to define a width of the at least one bank of the fusible links and are grouped such that at least some of the fusible links are disposed adjacently in a direction that is transverse with respect to a direction of the width of the at least one bank of the fusible links.

In accordance with an added feature of the invention, there is provided a generic fusible link configuration in or on integrated circuits, in particular highly integrated memory chips, that is distinguished by the fact that one or more banks of the fusible links, are divided up into smaller units. To restrict the width(s) of the bank or banks, the smaller units of the fusible links are grouped such that at least some of the fusible links are located beside one another transversely with respect to the width direction of the bank.

In accordance with an additional feature of the invention, the units are grouped such that the original width of the fusible-link bank is halved, and the two halves of the fusible-link bank are located beside each other in a direction at right angles to the width direction.

In this case, at their one ends, where they adjoin one another transversely with respect to the width direction, the fusible links are connected to a ground track and, at their opposite, other ends, are in each case wired individually to the associated evaluation logic unit.

The wiring of the fusible links to the evaluation logic unit is carried out, for example, in a single plane of the chip. Instead, this wiring can also be routed in a number of wiring planes, in order to keep the increase in area which results from this wiring as small as possible.

Ideally, attempts will be made to route the conductor tracks for making contact with the additional large contact pads in such a way that halving the width of the fusible-link bank or banks is sufficient to ensure that all of the fusible links of the bank or banks are accessible, and to keep the additional expenditure on area resulting from the new wiring of the fusible links as small as possible.

Depending on the requirement for routing the conductor tracks from the additional large contact pads to the small contact pads, however, further division of the fusible-link bank may also be necessary, in order to ensure access for the laser beam from above in order to sever the fusible links.

In the same way, the overall position of the fusible-link bank can be displaced while maintaining the position of the evaluation logic unit, but this entails a maximum of additional expenditure on area.

The fusible link configuration proposed according to the invention can be applied both to column and to row fusible links and also to any other type of fusible links, for example for trimming internal voltages.

Other features which are considered as characteristic for the invention are set forth in the appended claims.

Although the invention is illustrated and described herein as embodied in a fusible link configuration in integrated circuits, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
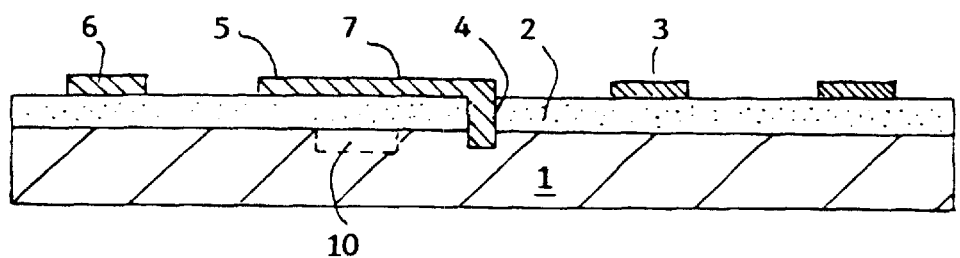
FIG. 1 shows a schematic cross sectional view of a prior art configuration of contact pads and conductor tracks disposed above a fusible-link bank.
Figure 2:
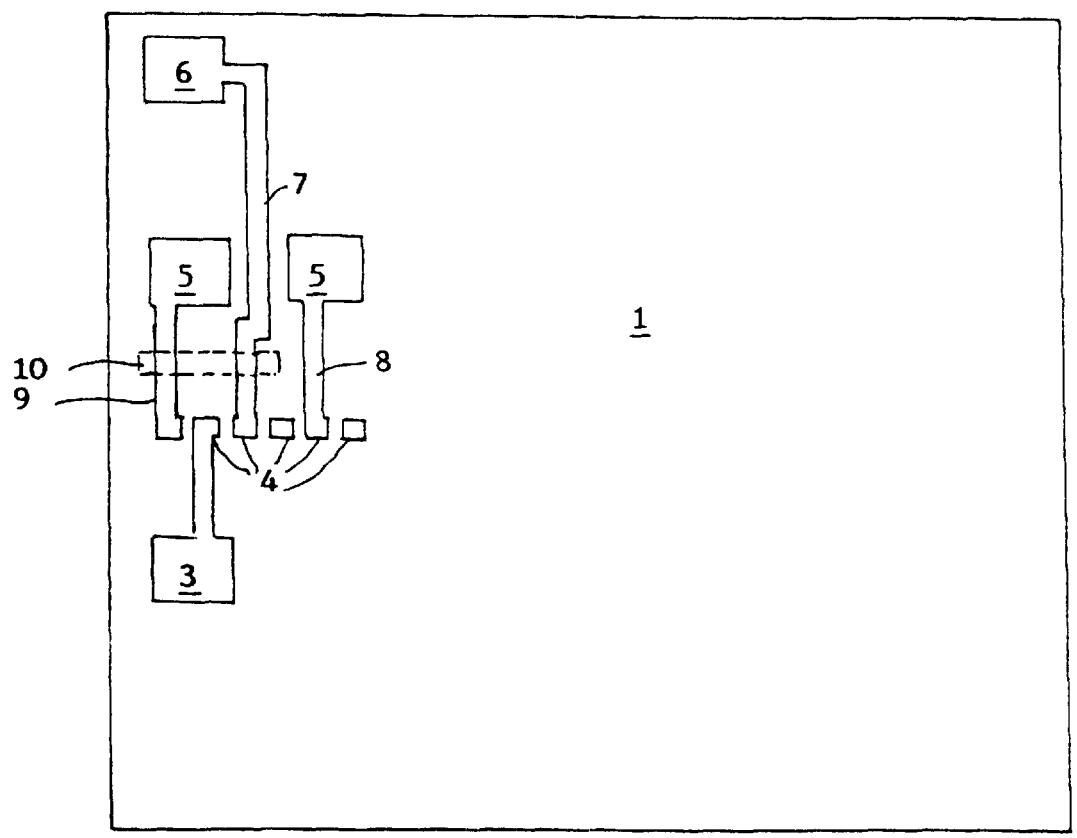
FIG. 2 shows a plan view of the prior art configuration of contact pads and conductor tracks disposed above the fusible-link bank.
Figure 3:
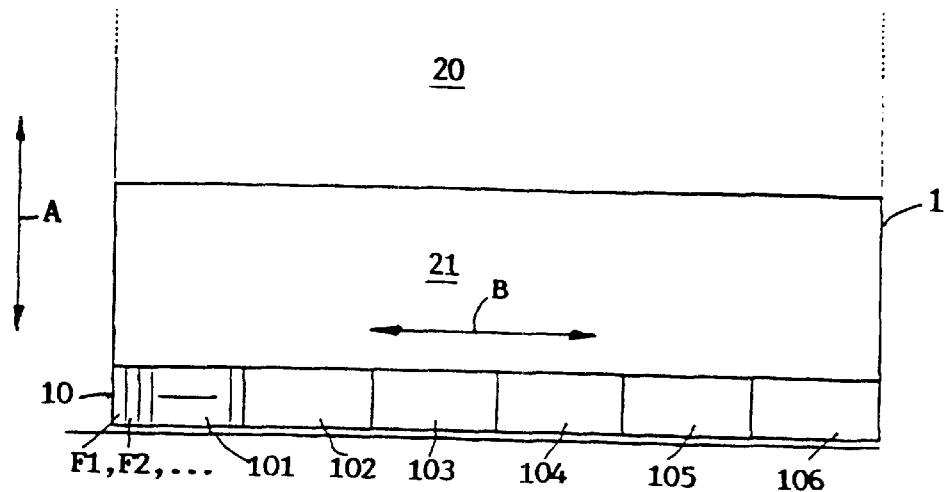
FIG. 3 shows a schematic plan view of a section of a prior art memory chip with a memory field segment.

The configurations shown in FIGS. 1 to 3 represent the prior art and have already been described above.

Figure 4:
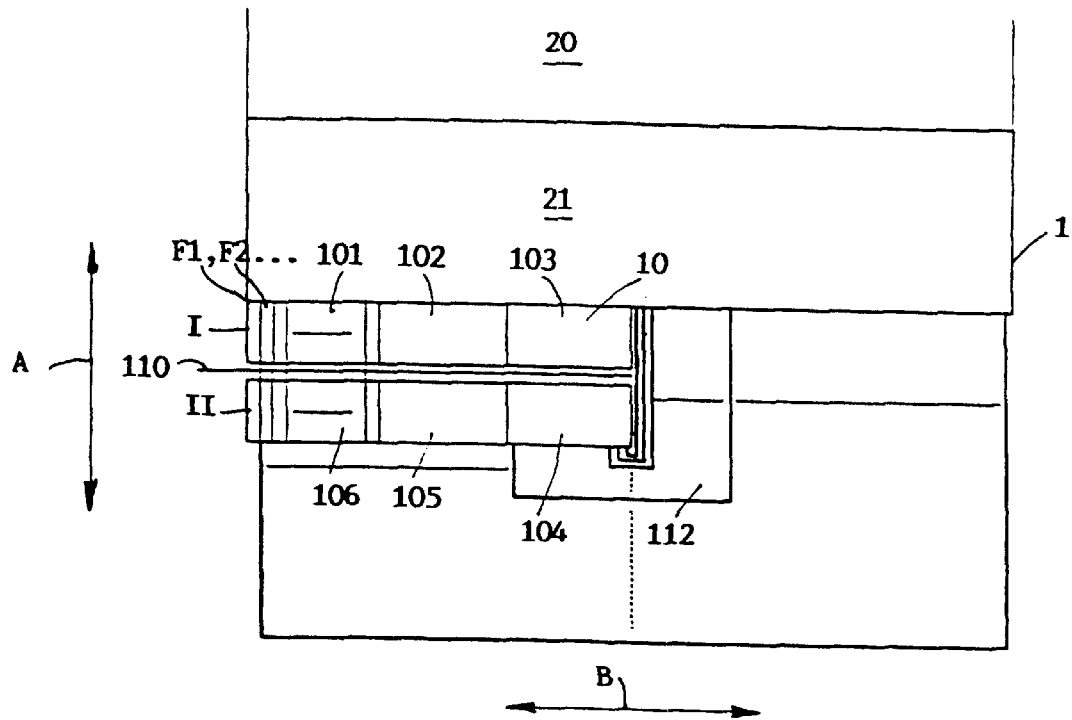
FIG. 4 shows a plan view of a section of a memory chip with an exemplary embodiment of an inventive fusible link configuration.

Referring now to FIG. 4, a fusible link configuration can be seen. The fusible links $F_1, F_2, \ldots$ belonging to one bank 10 are subdivided into boxes 101, 102, 103, 104, 105, and 106, and the latter are grouped beside each other in the direction of the arrow A in two halves I and II.

A comparison between the fusible link configuration shown in FIG. 4 and the known fusible link configuration shown in FIG. 3 clearly shows that the fusible link configuration according to the invention advantageously leaves half the width of the memory field segment 21 free. This space can be used for routing conductor tracks between the additional and the normal contact pads without any of the fusible links being covered by these conductor tracks. One side of the fusible links $F_1, F_2, \ldots$ is connected to a ground line 110, and the other side is wired to the evaluation logic unit 21 by means of conductor tracks or wiring 112. This wiring 112 can be routed in one or more wiring planes, in order to keep the increase in area which results from this wiring as small as possible.

One example of the increase in area because of the wiring 112 if the latter is routed in a plane of the chip is given as follows: Assume, for example, that the height of the fusible-link boxes 101, 102, 103, ... is 14 $\mu$m (in the direction of arrow A) and add 36 $\mu$m-18 $\mu$m for the additional wiring 112, if routed in a metal plane with a cell-field pitch of 0.5 $\mu$m over the entire chip length, ×2 (since two rows I and II of fusible-link banks are present in the spine). This gives 0.5 mm$^2$ and corresponds to 1.6% of the total chip area of a 64 M memory chip, for example.

Of course, the embodiment shown in FIG. 4, in which the fusible-link boxes are divided into two halves and configured beside each other in two parallel rows I and II in the direction of the arrow A, is merely exemplary.

Ideally, attempts will be made to route the additional conductor tracks for making contact with the additional large contact pads in such a way that the halving of the width of the fusible-link bank 10 (shown in FIG. 4) is sufficient to ensure that all the fusible links $F_1, F_2, \ldots$ in the bank 10 are accessible to the laser beam. Of course, further division of the bank 10 can also be imagined, in order to ensure the access from above.

Likewise, the entire position of the bank 10 can be displaced while maintaining the position of the evaluation logic unit 21. However, this may entail too large an expenditure on area for the wiring.

We claim:

1. A fusible link configuration in or on integrated circuits, comprising:

a memory field segment;

at least one bank of fusible links defining a total number of said fusible links and configured beside and associated with said memory field segment, said at least one bank of said fusible links divided into units of said fusible links, each one of said units of said fusible links including a smaller number of said fusible links than said total number of said fusible links, said units of said fusible links being grouped to define a width of said at least one bank of said fusible links and being grouped such that at least some of said fusible links are disposed adjacently in a direction that is transverse with respect to a direction of said width of said at least one bank of said fusible links; and an evaluation logic unit electrically connected to said fusible links for determining whether one or more of said fusible links is severed.

2. The fusible link configuration according to claim 1, wherein said at least one bank of said fusible links is divided into two halves of said fusible links that are disposed beside each other at right angles with respect to the direction of said width of said at least one bank of said fusible links, and said width of said at least one bank of said fusible links is one half of a width that it would have if it were not divided into said two halves.

3. The fusible link configuration according to claim 1, comprising:

a ground track;

said at least one bank of said fusible links divided into a first half of said fusible links and a second half of said fusible links;

said first half of said fusible links having first ends individually wired to said evaluation logic unit and having second ends connected to said ground track;

said second half of said fusible links having first ends individually wired to said evaluation logic unit and having second ends connected to said ground track; and said second ends of said fusible links of said first half disposed to adjoin said second ends of said fusible links of said second half in the direction that is transverse with respect to the direction of said width of said at least one bank of said fusible links.

4. The fusible link configuration according to claim 3, comprising wiring, connecting said fusible links to said evaluation logic unit, that is routed in at least one metallization plane of a chip.

5. In combination with a highly integrated memory chip, a fusible link configuration, comprising:

a memory field segment;

at least one bank of fusible links defining a total number of said fusible links and configured beside and associated with said memory field segment, said at least one bank of said fusible links divided into units of said fusible links, each one of said units of said fusible links including a smaller number of said fusible links than said total number of said fusible links, said units of said fusible links being grouped to define a width of said at least one bank of said fusible links and being grouped such that at least some of said fusible links are disposed adjacently in a direction that is transverse with respect to a direction of said width of said at least one bank of said fusible links; and an evaluation logic unit electrically connected to said fusible links for determining whether one or more of said fusible links is severed.

* * * * *